US008956889B2

(12) United States Patent
Lin et al.

(10) Patent No.: US 8,956,889 B2
(45) Date of Patent: Feb. 17, 2015

(54) METHOD OF TESTING THROUGH SILICON VIAS (TSVS) OF THREE DIMENSIONAL INTEGRATED CIRCUIT (3DIC)

(71) Applicants: Hung-Chih Lin, Hsinchu (TW); Mill-Jer Wang, Hsinchu (TW); Ching-Nen Peng, Hsinchu (TW); Hao Chen, Luzhou (TW)

(72) Inventors: Hung-Chih Lin, Hsinchu (TW); Mill-Jer Wang, Hsinchu (TW); Ching-Nen Peng, Hsinchu (TW); Hao Chen, Luzhou (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 150 days.

(21) Appl. No.: 13/800,626

(22) Filed: Mar. 13, 2013

(65) Prior Publication Data
US 2013/0196458 A1 Aug. 1, 2013

Related U.S. Application Data (63) Continuation of application No. 13/006,639, filed on Jan. 14, 2011, now Pat. No. 8,421,073.

(60) Provisional application No. 61/406,763, filed on Oct. 26, 2010, provisional application No. 61/407,268, filed on Oct. 27, 2010.

(51) Int. Cl.
*H01L 21/66* (2006.01)
*H01L 23/00* (2006.01)
(Continued)

(52) U.S. Cl.
CPC ............... *H01L 22/14* (2013.01); *H01L 22/34* (2013.01); *H01L 24/02* (2013.01); *H01L 25/0657* (2013.01); *H01L 22/32* (2013.01); *H01L 24/13* (2013.01); *H01L 24/16* (2013.01); *H01L 25/50* (2013.01); *H01L 2224/0237* (2013.01); *H01L 2224/02372* (2013.01); *H01L 2224/13025* (2013.01); *H01L 2224/13144* (2013.01); *H01L 2224/13147* (2013.01); *H01L 2224/16146* (2013.01); *H01L 2224/16155* (2013.01); *H01L 2224/81193* (2013.01); *H01L 2225/06513* (2013.01); *H01L 2225/06517* (2013.01); *H01L 2225/06541* (2013.01); *H01L 2225/06596* (2013.01); *H01L 2924/01029* (2013.01);
(Continued)

(58) Field of Classification Search
USPC .......................................... 438/18, 667, 672
See application file for complete search history.

(56) References Cited

U.S. PATENT DOCUMENTS

2004/0262604 A1  12/2004  Lee
2010/0013512 A1  1/2010  Hargan et al.
(Continued)

FOREIGN PATENT DOCUMENTS

CN  101271873  9/2008

OTHER PUBLICATIONS

Office Action dated Apr. 3, 2013 from corresponding application No. CN201110317964.5.

*Primary Examiner* — Long Pham
(74) *Attorney, Agent, or Firm* — Lowe Hauptman & Ham, LLP (57) ABSTRACT In a method of testing a plurality of through silicon vias (TSVs) chained together by interconnect on a substrate, a test signal is applied to a first test pad among a plurality of test pads, and a return signal is measured at a second test pad among the plurality of test pads. At least one test pad of the plurality of test pads is grounded to the substrate. The remaining test pads of the plurality of test pads are either connected to the plurality of chained TSVs or are grounded.

20 Claims, 9 Drawing Sheets (51) Int. Cl.
*H01L 25/065* (2006.01)
*H01L 25/00* (2006.01)

(52) U.S. Cl.
CPC . *H01L2924/01079* (2013.01); *H01L 2924/014* (2013.01); *H01L 2924/01005* (2013.01); *H01L 2924/01006* (2013.01); *H01L 2924/01033* (2013.01)

USPC .............................. 438/18; 438/667; 438/672

(56) References Cited

U.S. PATENT DOCUMENTS

2010/0153043 A1 6/2010 Su et al.
2010/0156453 A1 6/2010 Doong et al.

METHOD OF TESTING THROUGH SILICON VIAS (TSVS) OF THREE DIMENSIONAL INTEGRATED CIRCUIT (3DIC)

CROSS-REFERENCE TO RELATED APPLICATIONS

The present application is a continuation of U.S. patent application Ser. No. 13/006,639, filed Jan. 14, 2011, which claims the priority of U.S. Provisional Applications Ser. No. 61/406,763, filed Oct. 26, 2010, and Ser. No. 61/407,268, filed Oct. 27, 2010. All of the above-listed applications are incorporated herein by reference in their entireties.

BACKGROUND

The integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

The volume occupied by the integrated components is near the surface of the semiconductor wafer. Although dramatic improvements in lithography have resulted in considerable improvements in two-dimensional (2D) integrated circuit formation, there are physical limitations to the density that can be achieved in two dimensions. One of these limitations is the minimum size needed to make these components. Further, when more devices are put into one chip, more complex designs are required. An additional limitation comes from the significant gains in the number and length of interconnections between devices as the number of devices increases. When the number and length of interconnections increase, both circuit RC delay and power consumption increase.

Three-dimensional integrated circuits (3DIC) were thus proposed, wherein dies may be stacked, with wire-bonding, flip-chip bonding, and/or through-silicon vias (TSV) being used to stack the dies together and to connect the dies to package substrates.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
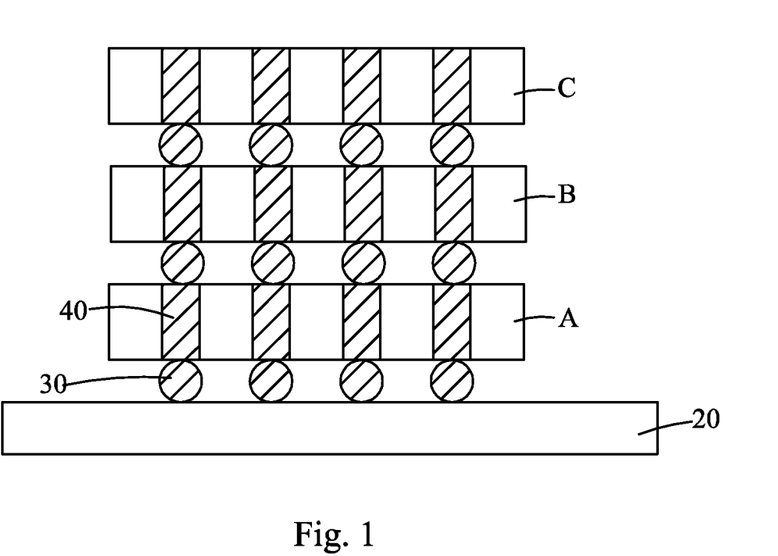
FIG. 1 shows a cross-sectional view of a three-dimensional integrated circuit (3DIC) structure, in accordance with some embodiments.

FIG. 1 shows a cross-sectional view of a three-dimensional integrated circuit (3DIC) structure, in accordance with some embodiments. FIG. 1 shows dies A, B, and C stacked on top of one another on a substrate 20. Each of the dies A, B, and C has one or more through silicon vias 40 (TSVs) for inter-die communications and heat dissipation. The TSVs 40 are connected to other TSVs or substrate 20 via metal bumps 30, which could be electrically connected to integrated circuits (not shown) in each die. The metal bumps (and posts) 30 could be made of various types of metal, such as solder, gold, copper, etc.

The manufacturing of dies involves complex substrate processing operations and handling. To prepare 3DIC structures, such as the one shown in FIG. 1, dies need to be pretested to separate the good and bad dies. Only good dies are selected for the construction of the 3DIC structures. Good dies are stacked together to form the 3DIC structures. Current electrical tests of dies mainly focus on electrical performances of integrated circuits on the dies. To directly test the quality and properties of a TSV and its associated metal bump(s)/post(s)/pillar(s) requires a high precision automatic test equipment (ATE) due to the low resistivity, such as in the range of several milliohms, and capacitance, such as in the range of several $10^{-15}$ farad, of TSVs and metal bumps. The current ATEs are not configured for commercial testing of chips and 3DICs with TSVs, since they do not have high resolution to test individual TSVs and bumps.

Early testing of substrates and 3DIC structures with TSVs would allow poorly formed TSVs and metal bumps to be identified at an early stage to enable correcting the process(es) and to prevent packaging of devices that already have problems. Various structures have been proposed to test capacitance, resistance, or frequency separately. However, different structures are needed for testing different properties of TSVs. The test structure(s) described in accordance with some embodiments below could be used to test different types of electrical properties of TSVs and their associated bumps.

Figure 2A:
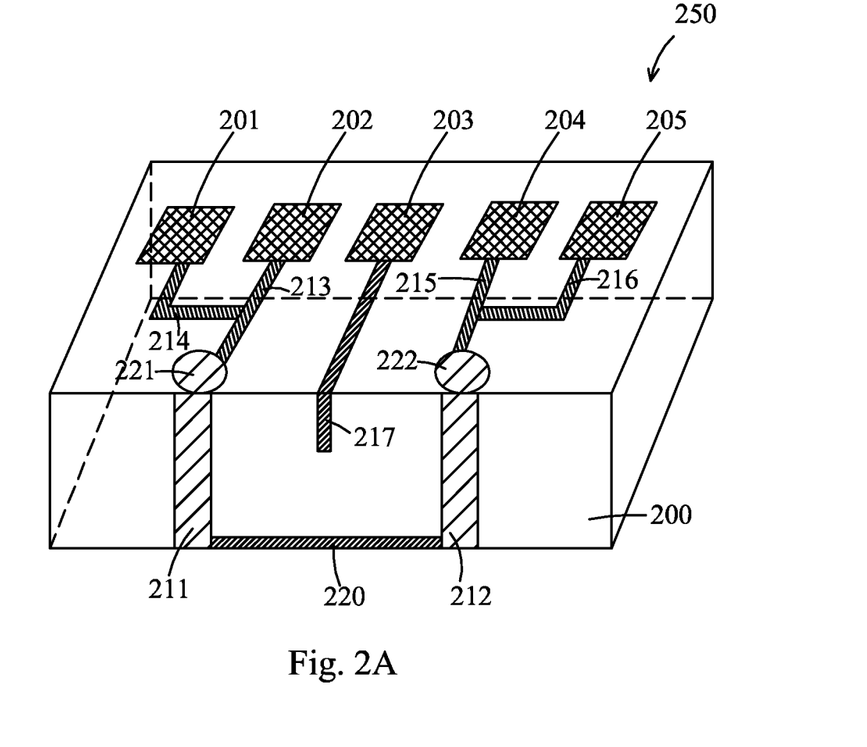
FIGS. 2A-2D each shows a perspective view of a substrate with a test structure, in accordance with some embodiments.

FIG. 2A shows a perspective view of a substrate 200 with a test structure 250, in accordance with some embodiments. The substrate 200 has five metal pads, numbered 201, 202, 203, 204, and 205, and TSVs, 211, and 212. TSVs 211 and 212 are connected via a redistribution structure 220 of a redistribution layer (RDL), or a top metal layer. The TSVs 211 and 212 and the redistribution layer 220 are merely examples. There are additional TSVs and redistribution structures that are not shown in FIG. 2A. The five metal pads, 201-205, are probing pads. Pads 201 and 202 are connected to TSV 211 via interconnects 213 and 214, which may include metal lines and vias at more than one level. The interconnects 213 and 214 shown in FIG. 2A are merely schematic drawings. The interconnects 213 and 214 may connect with TSV 211 via bump 221, or may connect directly with TSV 211. In a similar manner, pads 204 and 205 are connected to TSV 222. Pad 203 is grounded to the silicon substrate 200 via interconnect 217.

Figure 2B:
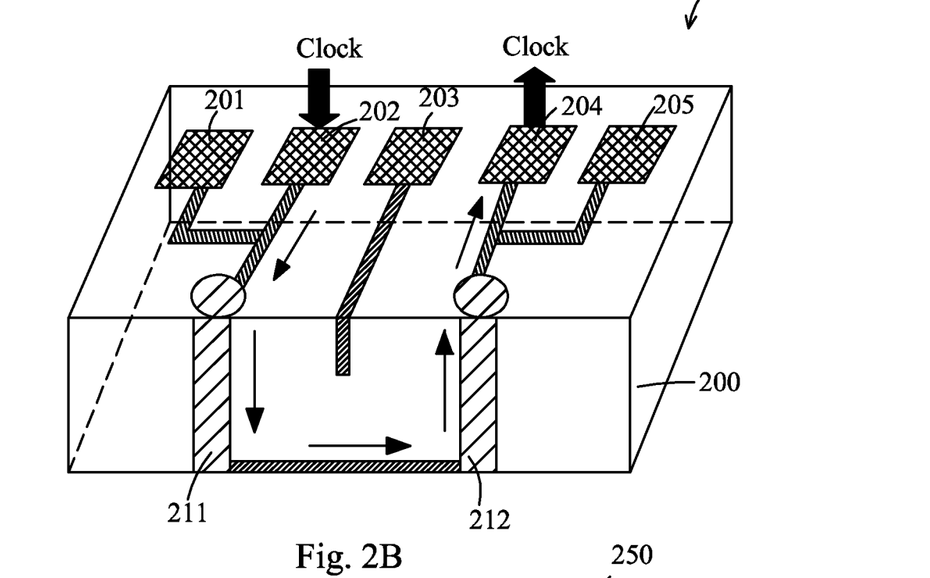

The five pads and their connections with the TSVs 211, 212 and the silicon substrate 200 enable the connected TSV structures to be tested for various properties, e.g., one or more of frequency, resistance, capacitance, and leakage. FIG. 2B shows pads 202 and 204 being used for frequency testing, in accordance with some embodiments. Clock frequency is entered at pad 202, which is connected to TSVs, such as TSV 211, 212, and redistribution structures, such as structure 220, and returns to pad 204. The output clock frequency is measured at pad 204. A number of TSVs may be chained together liked a daisy chain for testing. These TSVs may be connected through redistribution structures, such as structure 220. The test results can be use to check signal performance changes, such as by eye-diagram with parameters of amplitude, jitter, and/or delay, to reveal information related to quality of TSVs and interfaces. Alternatively, pad 201 can be used for inputting clock frequency, instead of pad 202, and pad 205 can be used for measuring output frequency, instead of pad 204.

Figure 2C:
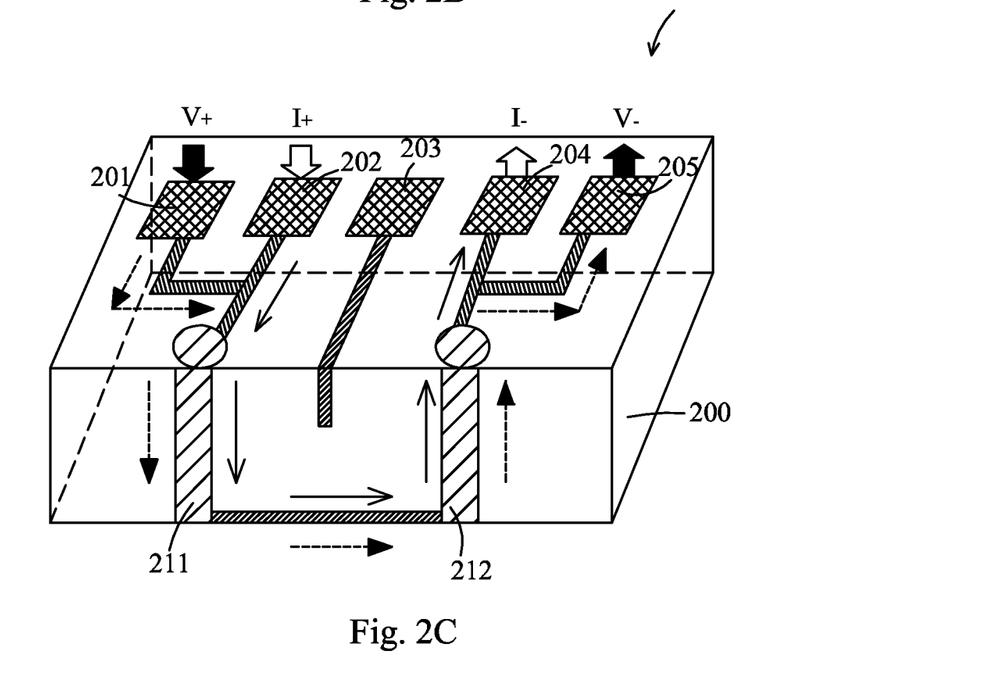

FIG. 2C shows pads 201, 202, 204, and 205 being used for resistance testing, in accordance with some embodiments. A current is applied to flow between pad 202 and pad 204. A voltage drop can be measured by using pad 201 and pad 205. In this method, a current is forced on the structure and a voltage drop is measured. Alternatively, a voltage can be applied at pad 201 to achieve a current between pad 202 and pad 204. The voltage drop is measured at pad 205, and the current is also measured. In this method, a voltage is forced on the structure and both current and voltage drop are measured. Based on the data collected, the resistance of the TSVs connected can be calculated by the four-point-probes method. As mentioned above, the resistance of an individual TSV is too small to be detectable by ATE. With a number of TSVs being chained together, the signals are enhanced to allow measurement of resistance. The pads used for current and voltage measurement can be switched. For example, voltage can be applied at pad 202 and measured at pad 204, and current can be applied at pad 201 and measured at pad 205. Pad 203 is disconnected during resistance testing.

Figure 2D:
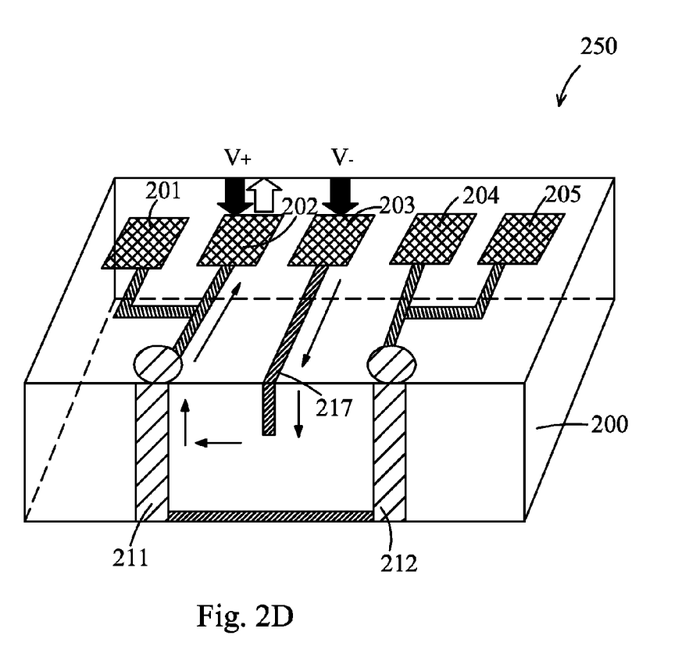

FIG. 2D shows pads 202, and 203 being used for capacitance and leakage tests, in accordance with some embodiments. Voltage is applied at pad 202 and pad 203, with one pad applying a voltage higher than the other to pre-charge the structure connected to and surrounding pads 202 and 203. Afterwards, the capacitance can be calculated by sinking a current and by measuring the discharge rate at pad 202 (such as by measuring voltage and time constant). Using pad 202 is merely an example. Alternatively, pads 201, 204 and 205 can be used in place of pad 202 for measurement. To measure leakage of TSVs, voltage is applied on pad 203 and current is measured at pad 202 for leakage amount. Alternatively, voltage can be applied on pad 203 and currently can be measured at pad 203. The test enables detecting leakage of any TSV, such as TSVs 211 and 212, that is connected to pad 202. Similarly, using pad 202 with merely an example. Alternatively, pads 201, 204 and 205 can be used instead of pad 202 for measurement.

The test structures shown in FIGS. 2A-2D are schematic diagrams that show how the probing pads (or test pads) are used to conduct property tests for the TSVs, the redistribution structures between the TSVs and also the metal bumps connected to the TSVs. As mentioned above, the resistivity, capacitance, and leakage of a single TSV may be too small to measure with existing electrical testers. To enable measuring resistivity, capacitance, and leakage, more TSVs are chained together to increase the signal level for detection.

Figure 3A:
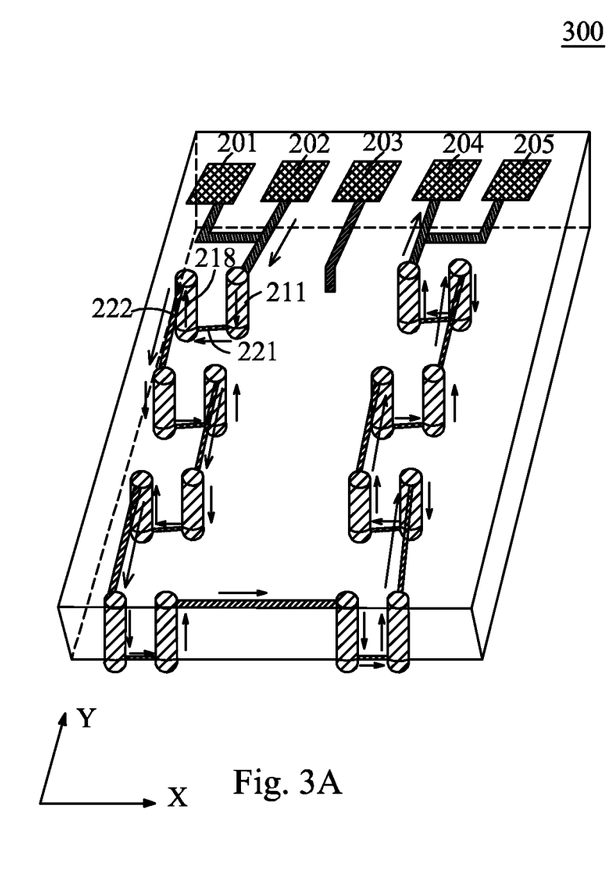
FIG. 3A shows a perspective view of a device area (or test area), in accordance with some embodiments.

FIG. 3A shows a perspective view of a device area (or test area) 300, in accordance with some embodiments. A number of TSVs, such as TSVs 211 and 218, are chained together for the resistance, capacitance, frequency, and leakage tests described above. FIG. 3A shows how the TSVs are chain together via redistribution structures on the bottom, such as structure 221, and redistribution structures on the top, such as structure 232. The number of TSVs chained together can be any number, small or large. In some embodiments, the number of TSVs chained together is in a range from about 10 to about 100. In some other embodiments, the number of TSVs chained together is in a range from about 50 to about 200. In yet some other embodiments, the number of TSVs chained together is in a range from about 100 to about 300.

Figure 3B:
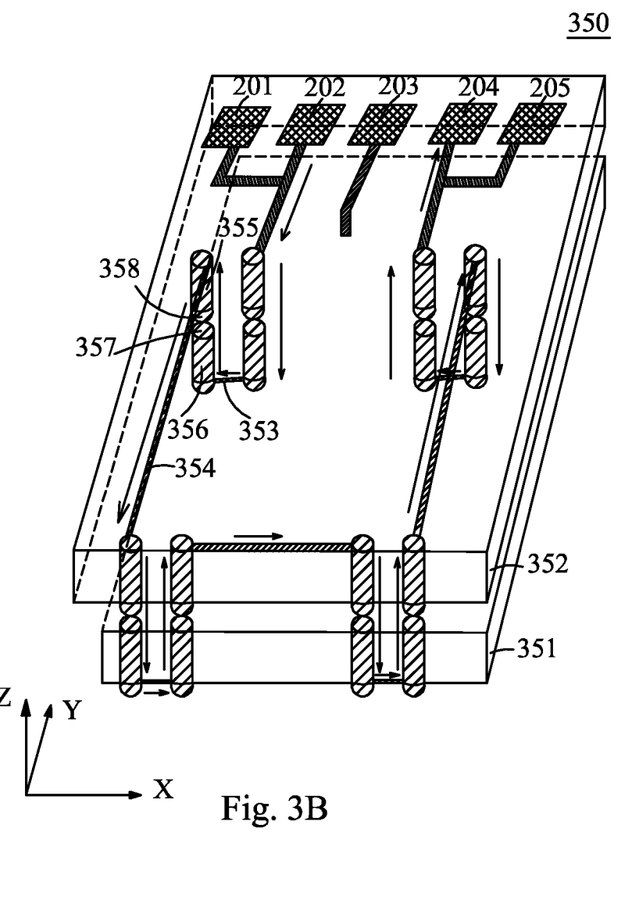
FIG. 3B shows a perspective view of another device area (or test area), in accordance with some embodiments.

The test structures shown in FIG. 3A include TSVs in the same level. In some embodiments, the TSVs chained (or connected) together for testing are on more than one level, or on more than one chips. FIG. 3B shows a perspective view of a device area (or test area) 350, in accordance with some embodiments. There are two substrates (or chips) 351 and 352 in the device area 350. A number of TSVs in substrates 351 and 352 are chained together for the resistance, capacitance, frequency, and leakage tests described above.

FIG. 3B shows how the TSVs are chain together via redistribution structures on the bottom of substrate 351, such as structure 353, and redistribution structures on the top, such as structure 354. Since the TSVs, such as TSVs 355 and 356, on different levels (or substrates) are connected to one another via bumps, such as bumps 357, 358, or other types of conductive structures, the testing conducted also test the quality and properties of bumps formed. The number of TSVs chained together can be any number, small or large. In some embodiments, the number of TSVs chained together is in a range from about 10 to about 100. In some other embodiments, the number of TSVs chained together is in a range from about 50 to about 200. In yet some other embodiments, the number of TSVs chained together is in a range from about 100 to about 300. The arrows in FIGS. 3A and 3B indicating the flow of current in measurements involving pads 202 and 204 and structures in FIGS. 3A and 3B are merely examples. Other arrangements are also possible.

The device area 350 described above includes two substrates. Alternatively, there could be more than two substrates, such as three or four, which are stacked together. These multi-layers of substrates (or chips) are interconnected by TSVs, whose qualities and properties can be tested by structures similar to the ones described above, and their associated metal bumps. The TSV tests can be performed before and/or after a chip is stacked above the chip underneath.

Figure 4A:
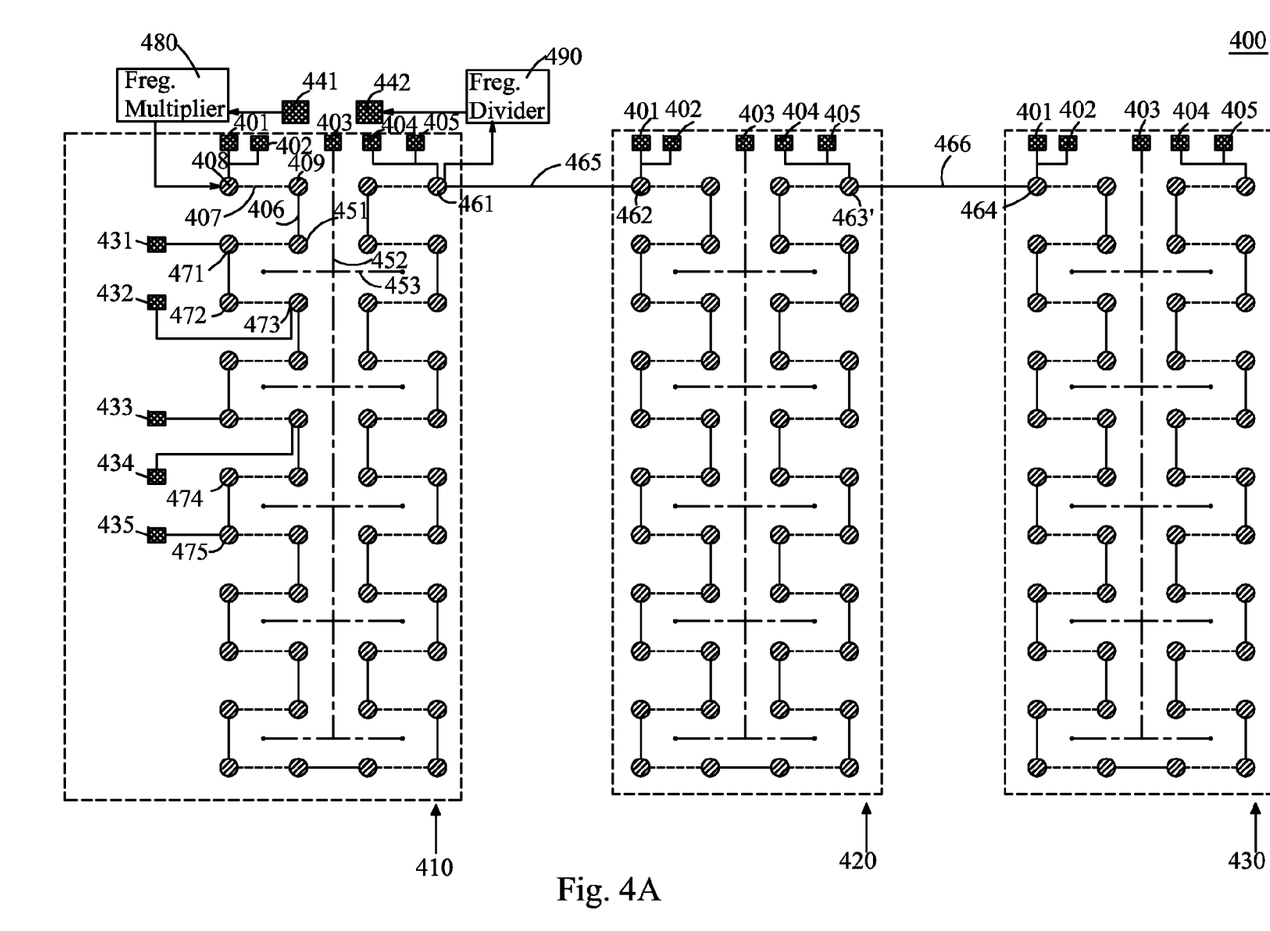
FIG. 4A shows a top view of a test area for TSVs, in accordance with some embodiments.

FIG. 4A shows a top view of a test area 400 for TSVs, in accordance with some embodiments. FIG. 4 shows test regions 410, 420, and 430. In some embodiments, there are other test regions similar to test regions 410, 420, and 430 in test area 400. In each test region 410, 420, or 430, there are at least 5 test pads, similar to test pads 201-205 described above. For example, test 410 has test pads 401, 402, 403, 404, and 405, which are similar to test pads 201, 202, 203, 204, and 205. However, test pads are not needed for each test region 410, 420, or 430. The TSVs in two or three regions in FIG. 4 can be chained together and be tested by one of the three sets of test pads shown in FIG. 4. In some other embodiments, the test pads do not need to be arranged to be next to one another. For example, test pads 401, 402, and 403 can be used with test pads 424 and 425 to perform the electrical tests described above.

There are upper interconnect, symbolized by solid lines (such as line 406), connecting the upper portions of TSVs, such as TSVs, 409, and 451. There are also lower interconnect, symbolized by dotted lines (such as line 407), connecting the lower portions of TSVs, such as TSVs 408 and 409. The TSVs in test areas 410, 420, and 430 are chained together to increase the signal levels (or intensity of signals). As described above for FIG. 3B, the interconnect, such as interconnect 353 and 354, used in connecting the TSVs may be metal lines at one level or may involve metal lines and vias at different levels. FIG. 4 shows that the grounding interconnect, such as interconnect 452, 453, connected to probing pad 404 for region 410 is spread out across the test region, in accordance with some embodiments. The spread-out layout of the interconnect provides sufficient grounding for the TSVs in region 410. The arrangement of grounding lines, such as interconnect 452 and 453, shown in FIG. 4 is merely an example. Other arrangements or layouts are also possible, as long as the TSVs are chained together.

Test areas 410, 420 and 430 can be tested independently, since each of the test areas has its own test pads, as shown in FIG. 4. Test region 420 has test pads 411-415, which are similar to test pads 401-405, and test region 430 has test pads 421-425, which are also similar to test pads 401-405. In some embodiments, TSV 461 of test region 410 is connected to TSV 462 of test region 420 via interconnect 465. The connection allows the TSVs in test regions 410 and 420 to be tested together or separately. For example, if the test pads 401 and 402 of test region 410 and test pads 414 and 415 of test region 420 are used, the frequency, resistance, capacitance, and leakage tests can be collected for TSVs in both regions. Such connection increases the number of TSVs in the tests. Similarly, TSV 463 of region 420 may be connected to TSV 464 of region 430 via interconnect 466. Such connection allows TSVs in region 430 to be tested with TSVs in other test regions, such as regions 410 and 420.

In addition to test pads 401-405, 411-415, and 421-425 in test regions 410, 420, and 430, there could be other test pads, such as test pads 431-435, which allows testing of a subset of TSVs in a test region, such as test region 410. For example, one or more of test pads 431-436 could be used in conjunction with one or more test pads 401-405 to understand how many TSVs need to be chained together to generate detectable test signals. In FIG. 4, the test pads 431-436 are next to test region 410. Alternatively, the additional test pads can be placed between test regions 410 and 420, or in other regions, to make connections to other TSVs in the test area 400. The additional test pads 431-436 may also be used to diagnose process issue across a substrate or pattern effect. For example, test pads 431-435 or test pads 401, 402, 436 and 431 of region 410 may be used to test resistivity of TSVs on the left side of test region 410, such as TSVs 471-475 and TSVs chained between them, to understand if TSVs formed at the edge of a repeating pattern generate different results in comparison to other regions in the test area 400.

In some embodiments, the test area 400 may also include two additional test pads 441, 442, and a frequency (or clock) multiplier 480 and a frequency divider 490. The multiplier 480 is connected to test pad 441 and TSV 408 (e.g., the TSV at the beginning of the chain to be tested) and the divider 490 is connected to test pad 442 and TSV 461 (e.g., the TSV at the end of the chain to be tested). The structures enable testing effects of high frequency inputs, such as frequency greater than or equal to about 5 GHz, on the TSVs. High frequency testing could be important for 3DICs. A frequency entered at test pad 441 can be multiplied to a higher number by the frequency multiplier 480 and goes through the TSV chain. The output frequency can be measured at test pad 442 after the frequency is divided by the divider 490.

Figure 4B:
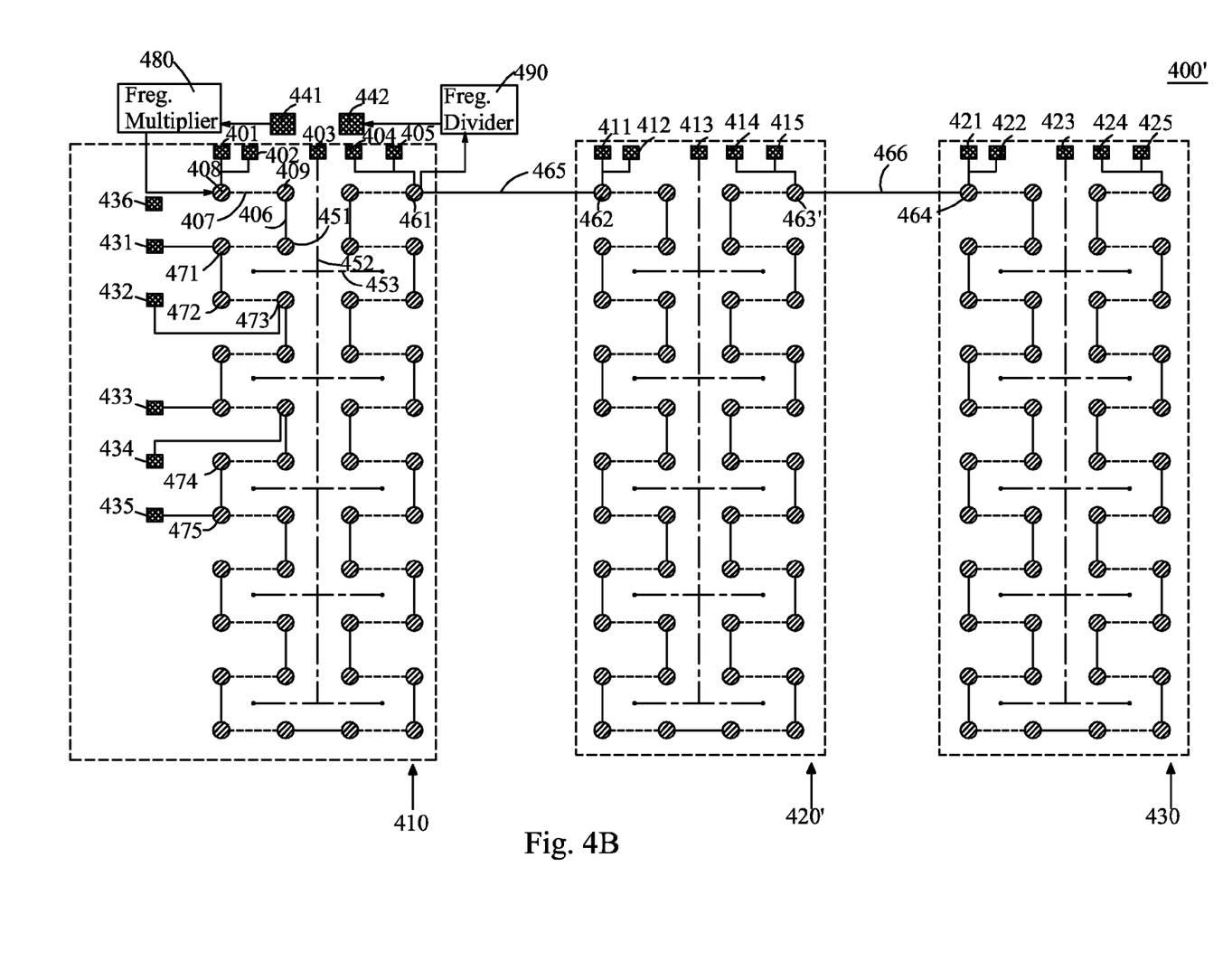
FIG. 4B shows a top view of a test area for TSVs, in accordance with some other embodiments.

Alternatively, different test regions in the test area may have TSVs and bumps with different pitches and sizes. FIG. 4B shows a test 400' that is similar to the test structure 400 in FIG. 4A with a test region 420' with TSVs and/or bumps with smaller sized and pitches, in accordance with some embodiments. The sized of TSVs, such as TSVs 462' and 463', are smaller than the sizes of TSVs in test regions 410 and 430. Similarly, the sizes of bumps (not shown) may also be different. The pitches (distance between centers of two neighboring TSVs) in test region 420' are different (smaller) from the pitches in test regions 410 and 430. The example shown here in FIG. 4B has smaller TSVs and smaller pitches. Alternatively, the sizes and pitches of TSVs and/or bumps may be larger than other test regions.

FIG. 4A shows the top view of test area 400. Test area 400 can be formed on a substrate, with all TSVs on one substrate, in accordance with some embodiments. Alternatively, test area 400 can be formed on two or more substrates in a manner similar to FIG. 3B, where TSVs on two substrates are connected to be tested.

Figure 5A:
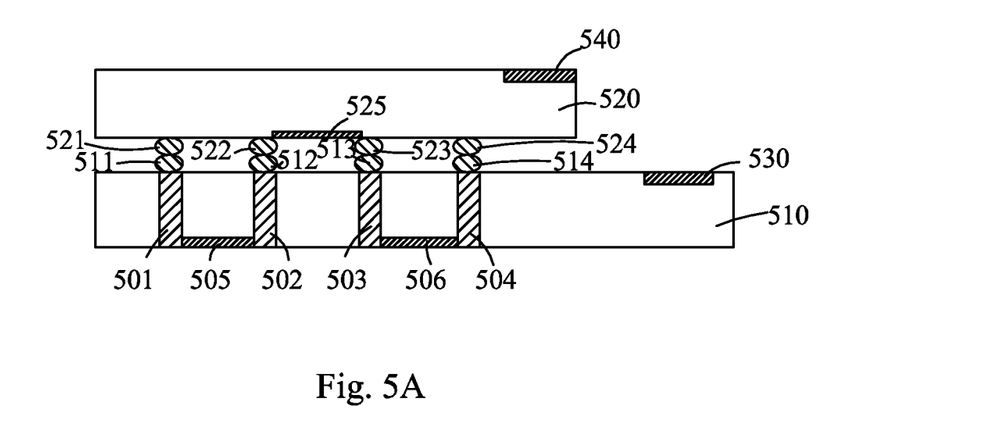
FIG. 5A shows a test structure for two substrates being bonded together, in accordance with some embodiments.

FIG. 5A shows a test structure for two substrates, 510 and 520, being connected by bumps, in accordance with some embodiments. The lower substrate 510 has TSVs, such as TSVs 501-504 and distribution structures, such as structures 505 and 506 for connecting TSVs, and bumps, such as bumps 511-514, for external connection. Above substrate (or chip) 510, there is substrate 520 with bumps, such as bumps 521-524, in contact with bumps, such as bumps 511-514, on substrate 510. On substrate 520, there are also redistribution structures, such as structure 525 connecting bumps. In some embodiments, there are TSVs on substrate 520 to be chained with TSVs on substrate 510 in a manner described in FIG. 3B. The cross-section view of FIG. 5A shows a probing pad 530 on substrate 510. The probing pad 530 can be any probing pad described above in FIGS. 2A-3B. Other probing pads could be disposed next to probing pad 530 in manner described in FIGS. 2A-4B.

Alternatively, the probing pad can be on substrate 520, such as probing pad 540. FIG. 5C shows probing pad 540 being disposed on substrate 520, in accordance with some embodiments. Other probing pads also could be disposed next to probing pad 540 in manner described in FIGS. 2A-4B. The probing pads 530 and 540 are electrically connected to the metal bumps and TSVs in substrates 510 and 520.

For the 3DICs described above, the bumps are aligned directly above the TSVs. However, they do not need to align directly above (or under) the TSVs. FIG. 5D shows the bumps being placed not directly over the TSVs, in accordance with some embodiments. There are connecting structures, such as structures 531-534, to connect bumps with TSVs.

In some embodiments, the probing pad 530 can be used to test substrate 510 before substrate 520 is bonded to substrate 510 to determine if the TSVs or TSVs/bumps are formed properly to have good electrical test results. After substrate 520 is bonded to substrate 510, the quality of bonding between these two substrates can be tested. If substrate 520 has TSVs, the quality and properties of the TSVs may also be tested by comparing the pre-bonding and post-bonding results.

Figure 5B:
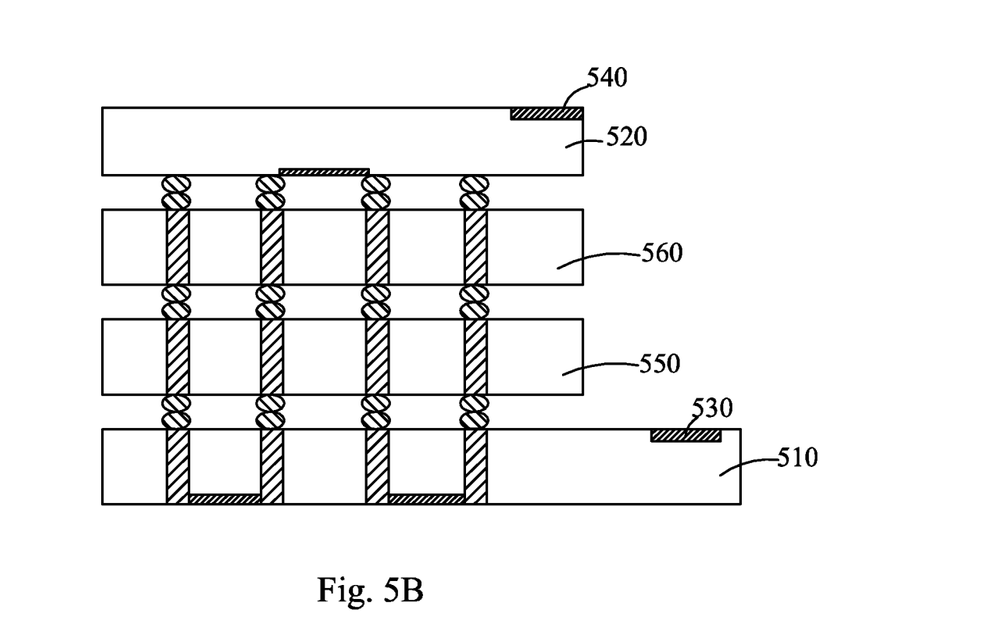
FIG. 5B shows a test structure for a number of substrates being bonded together, in accordance with some embodiments.
Figure 5C:
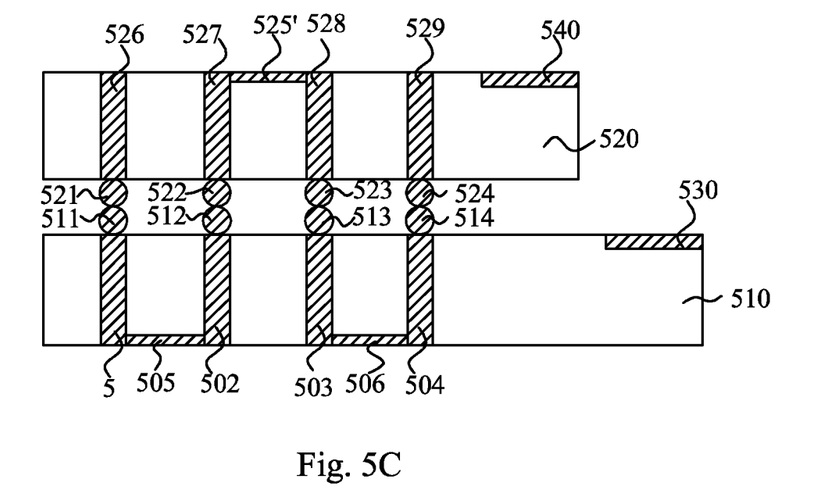
FIG. 5C shows a probing pad being disposed on an upper substrate, in accordance with some embodiments.
Figure 5D:
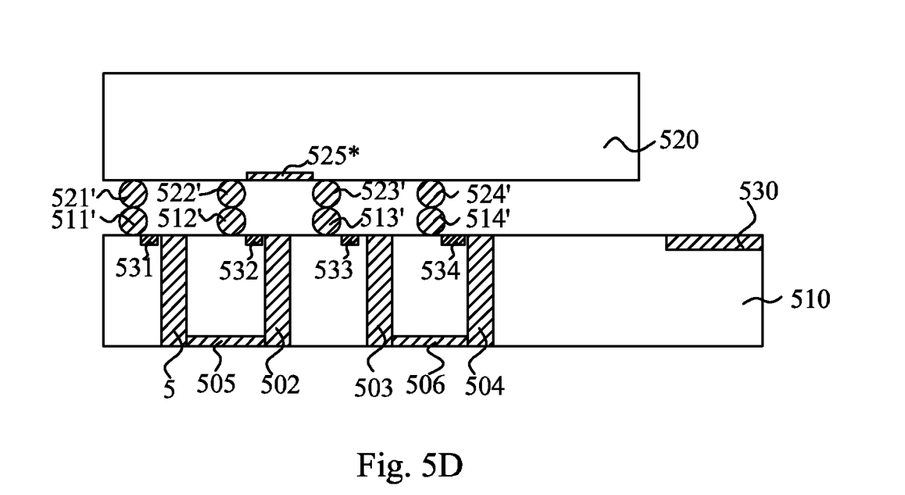
FIG. 5D shows the bumps being placed not directly over the TSVs, in accordance with some embodiments.

FIG. 5B show a device region with a number of substrates on top of each other, in accordance with some embodiments. The structure in FIG. 5B is similar to the structure in FIG. 5A with the difference that additional substrates 550 and 560 are stacked between substrates 510 and 520. The structure in FIG. 5B shows that multiple levels of chips with TSVs can be stacked on top of each other and the TSVs can be chained together to allow the electrical testing of cumulative and/or individual levels. If during the testing, a chip is found to have problems, the chip can be removed and be replaced with a functional one. In addition, the cause(s) of the problem(s) for a failed chip can be identified to prevent further misprocessing in the production line. Such intermediate-level testing is beneficial in identifying poor chips in the bonding sequence instead of waiting until the end of packaging the entire stack. In addition, such intermediate-level testing is useful in identifying the problem source early to prevent further misprocessing and to save cost.

Figure 6:
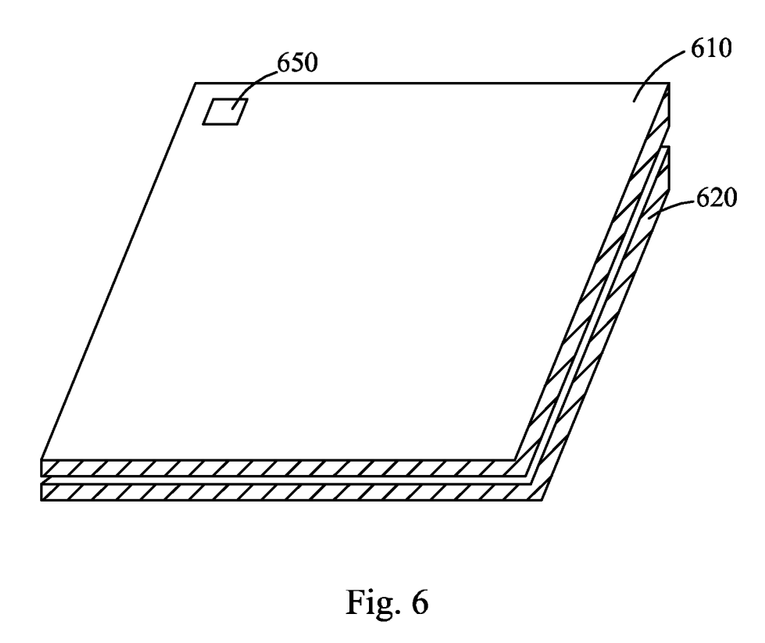
FIG. 6 shows a perspective view of a chip with a test area inside the chip area (or within a boundary defined by the scribe lines), in accordance with some embodiments.

FIG. 6 shows a perspective view of a chip 610 with a test area 650 inside the chip area (or within a boundary defined by the scribe lines, and on the same side with the product devices), in accordance with some embodiments. The test area 650 has the TSV and bump test structures described above. In some embodiments, the test area has structures that allow 2D and 3D testing of TSVs and bumps. If 3D testing is involved, the chip that is bonded to another chip 620, which also has a corresponding test area with TSVs and bumps connected to this chip. With a number of TSVs being chained together, the current ATEs can be used to perform the tests. Examples of existing ATEs include, but are not limited to, HP93000 from Verigy, T2000 from Advantest, and U-Flex from Teradyne.

The embodiments described above provide methods and structures for testing the properties of through silicon vias (TSVs) on a substrate or in a 3 dimensional integrated circuit (3DIC). The TSVs are chained together to increase the electrical signal, which is not detectable by automatic test equipment if a single TSV is tested. Five test pads are used to enable the testing of frequency, resistivity, capacitance, and leakage. One of the test pads is grounded. Two of the test pads are electrically connected to a TSV in the beginning of the chain the other two pads are electrically connected a TSV at the end of the chain. The test structure can be expanded to test TSVs and bumps in 3DIC. The pre-testing of TSVs on a substrate before packaging and during the process of 3DIC packaging can reduce the risk of continuing packing a device with faulty parts and also enable early identification of problems in the production line.

In a method of testing a plurality of through silicon vias (TSVs) chained together by interconnect on a substrate in accordance with some embodiments, a test signal is applied to a first test pad among a plurality of test pads, and a return signal is measured at a second test pad among the plurality of test pads. At least one test pad of the plurality of test pads is grounded to the substrate. The remaining test pads of the plurality of test pads are either connected to the plurality of chained TSVs or are grounded.

In some embodiments, a three dimensional integrated circuit (3DIC) comprises a first substrate and a second substrate bonded to the first substrate. The first substrate comprises a plurality of first through silicon vias (TSVs) chained together by interconnect. In a method of testing the 3DIC in accordance with some embodiments, a test signal is applied to a first test pad among at least five test pads on the first substrate, and a return signal is measured at a second test pad among the at least five test pads. One of the at least five test pads is grounded to the first substrate. Two of the remaining four test pads are electrically connected to one of the plurality of chained first TSVs. The remaining two test pads are electrically connected to another one of the plurality of chained first TSVs.

In a method of testing a plurality of through silicon vias (TSVs) chained together by interconnect on a substrate in accordance with some embodiments, a first test for testing a first parameter of the plurality of chained TSVs and a second test for testing a second parameter of the plurality of chained TSVs are performed. The substrate comprises at least one first test pad electrically connected to one end of the plurality of chained TSVs, at least one second test pad electrically connected to another end of the plurality of chained TSVs, and at least one third test pad grounded to the substrate. The first test comprises applying a first test signal to one of the first and second test pads and measuring a first return signal at the other of the first and second test pads. The second test comprises applying a second test signal to one of the first and third test pads and measuring a second return signal at the other of the first and third test pads.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method of testing a plurality of through silicon vias (TSVs) chained together by interconnect on a substrate, said method comprising:
    applying a test signal to a first test pad among a plurality of test pads, wherein at least one test pad of the plurality of test pads is grounded to the substrate, and wherein the remaining test pads of the plurality of test pads are either connected to the plurality of chained TSVs or are grounded, and
    measuring a return signal at a second test pad among the plurality of test pads.

2. The method of claim 1, wherein the interconnect that chains the plurality of TSVs includes at least one structure in a redistribution layer or a metal layer.

3. The method of claim 1, wherein the plurality of test pads includes five test pads among which
    one test pad is grounded to the substrate,
    two test pads are connected to one end of the plurality of chained TSVs, and
    the remaining two test pads are connected to the other end of the plurality of chained TSVs.

4. The method of claim 3, wherein
    the substrate comprises more than one test area, and
    each of the test areas has the five test pads.

5. The method of claim 1, wherein
    the substrate comprises more than one test area,
    the plurality of TSVs of the substrate are chained together in each of the test areas, and
    the TSVs chained in one of the test areas are further chained to the TSVs chained in another one of the test areas,
    the method further comprising testing the chained TSVs both in each of the test areas and across multiple said test areas.

6. The method of claim 1, wherein the plurality of TSVs are chained together in a daisy chain.

7. The method of claim 1, wherein
the substrate includes a plurality of test regions,
the TSVs in one of the plurality of test regions have a first size and a first pitch,
the TSVs in another one of the plurality of the test regions have a second size and a second pitch, and
at least one of the second size or the second pitch is different from the corresponding first size or first pitch.

8. The method of claim 1, further comprising:
connecting a frequency divider and a frequency multiplier to the chained TSVs, and
performing a high frequency test on the chained TSVs using the frequency divider and the frequency multiplier.

9. The method of claim 1, wherein
applying the test signal comprises inputting the test signal to the first test pad from a frequency multiplier, and
measuring the return signal inputted from the second test pad to a frequency divider.

10. The method of claim 1, wherein, in a frequency test, the test signal and the return signal are clock frequency signals.

11. The method of claim 1, wherein, in a resistance test, the test signal and the return signal are currents, the method further comprising, in the resistance test:
measuring a voltage drop across third and fourth test pads among the plurality of test pads, the third test pad coupled to the first test pad, and the fourth test pad coupled to the second test pad.

12. The method of claim 1, wherein, in a resistance test, the test signal and the return signal are voltages, the method further comprising, in the resistance test:
measuring a voltage drop across the first and second test pads; and
measuring a current flowing between third and fourth test pads among the plurality of test pads, the third test pad coupled to the first test pad, and the fourth test pad coupled to the second test pad.

13. The method of claim 1, wherein, in a capacitance test:
one of the first or second test pads is grounded to the substrate,
the other of the first or second test pads is connected to the plurality of chained TSVs,
applying the test signal comprises applying a first voltage to the first test pad, and
measuring the return signal at the second test pad comprises measuring a second voltage caused by sinking a current in the substrate,
the method further comprising, in the capacitance test:
measuring a discharge rate at the second test pad by measuring the second voltage and a time constant at the second test pad.

14. The method of claim 1, wherein, in a leakage test:
one of the first or second test pads is grounded to the substrate,
the other of the first or second test pads is connected to the plurality of chained TSVs,
applying the test signal comprises applying a voltage applied to the first test pad, and
measuring the return signal at the second test pad comprises measuring a leakage current.

15. A method of testing a three dimensional integrated circuit (3DIC), the 3DIC comprising a first substrate and a second substrate bonded to the first substrate, the first substrate comprising a plurality of first through silicon vias (TSVs) chained together by interconnect, said method comprising:
applying a test signal to a first test pad among at least five test pads on the first substrate, wherein one of the at least five test pads is grounded to the first substrate, and wherein two of the remaining four test pads are electrically connected to one of the plurality of chained first TSVs and the remaining two test pads are electrically connected to another one of the plurality of chained first TSVs; and
measuring a return signal at a second test pad among the at least five test pads.

16. The method of claim 15, wherein at least a portion of the interconnect that chains the plurality of first TSVs is on the second substrate.

17. The method of claim 15, wherein
the second substrate includes a plurality of second TSVs,
the plurality of second TSVs align with the plurality of corresponding first TSVs, and
the plurality of first TSVs and the plurality of second TSVs are chained together for electrical testing.

18. The method of claim 15, wherein
the 3DIC further comprises a third substrate,
the third substrate is sandwiched between the first substrate and the second substrate,
the third substrate has a plurality of third TSVs,
the plurality of third TSVs align with the plurality of corresponding first TSVs,
the first, second, and third substrates are bonded together by metal bumps, and
the plurality of first TSVs and the plurality of third TSVs are chained together for electrical testing.

19. The method of claim 15, wherein the grounded test pad is grounded to the first substrate through interconnect for grounding which spreads across an area with the plurality of first TSVs.

20. A method of testing a plurality of through silicon vias (TSVs) chained together by interconnect on a substrate, the substrate comprising at least one first test pad electrically connected to one end of the plurality of chained TSVs, at least one second test pad electrically connected to another end of the plurality of chained TSVs, and at least one third test pad grounded to the substrate, said method comprising:
performing a first test for testing a first parameter of the plurality of chained TSVs, the first test comprising applying a first test signal to one of the first and second test pads and measuring a first return signal at the other of the first and second test pads; and
performing a second test for testing a second parameter of the plurality of chained TSVs, the second test comprising applying a second test signal to one of the first and third test pads and measuring a second return signal at the other of the first and third test pads.

* * * * *